(12) United States Patent  
Iketani

(10) Patent No.: US 6,495,379 B2
(45) Date of Patent: Dec. 17, 2002

(54) SEMICONDUCTOR DEVICE MANUFACTURING METHOD

(75) Inventor: Koji Iketani, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/911,924

(22) Filed: Jul. 24, 2001

(65) Prior Publication Data

US 2002/0016013 A1 Feb. 7, 2002

(30) Foreign Application Priority Data

Aug. 3, 2000 (JP) .................................. P. 2000-236023

(51) Int. Cl.⁷ .......................... G01R 31/76; H01L 21/66
(52) U.S. Cl. .......................................... 438/15; 438/118
(58) Field of Search ............................. 438/15, 14, 118, 438/343, FOR 101; 257/787; 156/264, 226.1

(56) References Cited

U.S. PATENT DOCUMENTS

| | | | | |
|---|---|---|---|---|
| 5,896,036 A | * | 4/1999 | Wood et al. ................ 324/755 |
| 6,048,750 A | * | 4/2000 | Hembree ..................... 438/107 |
| 6,080,602 A | * | 6/2000 | Tani et al. .................... 438/110 |
| 6,211,960 B1 | * | 4/2001 | Hembree ..................... 356/400 |
| 6,215,194 B1 | * | 4/2001 | Nakabayashi ............... 257/620 |
| 6,309,911 B2 | * | 10/2001 | Hyoudo et al. .............. 438/106 |
| 6,368,893 B1 | * | 4/2002 | Tani et al. .................... 438/106 |

FOREIGN PATENT DOCUMENTS

| | | | |
|---|---|---|---|
| JP | H05-129473 | | 5/1993 |
| JP | 11-186301 A | * | 7/1999 |
| JP | 2000-124236 A | * | 4/2000 |
| JP | 2000-232183 A | * | 8/2000 |

* cited by examiner

Primary Examiner—Wael Fahmy
Assistant Examiner—Fernando Toledo
(74) Attorney, Agent, or Firm—Fish & Richardson P.C.

(57) ABSTRACT

According to the invention, the characteristics of semiconductor devices are measured while these devices are adhered to an adhesive sheet, and the semiconductor devices, at this time, are aligned in a predetermined manner. Further, a semiconductor device is captured in the field of view of a camera to identify its location, and the characteristics of semiconductor devices, which are adjacent to the semiconductor device, are measured, without a position recognition process being required for these devices. Consequently, a considerable reduction in working time is realized and is accompanied by an improvement in productivity.

6 Claims, 14 Drawing Sheets

OPERATION DIRECTION

OPERATION DIRECTION

SEMICONDUCTOR DEVICE MANUFACTURING METHOD

BACKGROUND OF THE INVENTION

The present invention relates to a method for manufacturing a semiconductor device, and relates in particular to a method for manufacturing a semiconductor device whereby a smaller mounting area can be provided by reducing the external size of a package without using lead forming, and a considerable reduction in manufacturing costs can be realized.

In the processing for the manufacture of a semiconductor device, the quality of each semiconductor chip formed on a wafer is determined; excellent semiconductor chips are separated from the wafer by dicing and are bonded to a lead frame; the semiconductor chips bonded to the lead frame are sealed by transfer molding using a die and resin injection process; and the sealed semiconductor chips are separated to provide individual semiconductor devices. A strip-shaped or hoop shaped frame is employed as the lead frame, but regardless of which frame is used, a single sealing process is used to simultaneously seal a plurality of semiconductor devices.

FIG. 13 is a diagram showing the process for checking semiconductor chips formed on a wafer. During this process, the quality of each semiconductor chip 1 formed on a wafer 15 is determined. First, the position of the wafer is recognized, and a needle 14 of a probe is fed a distance equivalent to the chip size and is brought into contact with the electrode pad of a semiconductor chip 1. In this state, an input signal wave, which is programmed in advance, is received from an electrode pad, and the output terminal emits a constant signal wave. A tester reads this signal and determines the quality of the semiconductor chip 1. And when the semiconductor chip 1 is determined to be defective, a mark is provided for it, so that when a recognition camera identifies this mark during the process performed to bond the semiconductor chip 1 to the lead frame, the defective semiconductor chip 1 can be removed.

FIG. 14 is a diagram showing a transfer molding process. During this process, the semiconductor chip 1 fixed to a die pad of a lead frame 2 by die bonding or wire bonding is mounted inside a cavity 4, formed of an upper and a lower die 3A and 3B, and an epoxy resin is injected into the cavity 4 to seal the semiconductor chip 1. Once the process has been completed, the lead frame 2 is cut to complete the fabrication of a separate semiconductor device (e.g., Japanese Patent Publication No. H05-129473).

For this process, as is shown in FIG. 15, multiple cavities 4a to 4f, a resin source 5 for injecting a resin, a runner 6, and gates 7 for injecting the resin into the cavities 4a to 4f via the runner 6, are formed in the surface of the die 3B. For example, if ten semiconductor chips 1 are mounted on a single lead frame, ten cavities 4, ten gates 7 and one runner 6 are formed for one lead frame. And the cavities 4 equivalent to, for example, twenty lead frames are formed in the inner surfaces of the die 3.

Following the transfer molding process, the semiconductor chips 1 are cut off the lead frame and are separated to form semiconductor devices. These semiconductor devices are sorted in accordance with the characteristics (the hfe ranks) detected during the measurement process, and after being taped, are shipped.

FIG. 16 is a diagram showing a semiconductor device obtained by transfer molding. The semiconductor chip 1 whereon elements, such as transistors, are formed is securely attached to an island 8 of the lead frame by a brazing material 9, such as solder; the electrode pad of the semiconductor chip 1 is connected to a lead terminal 10 by a wire 11; the periphery of the semiconductor chip 1 is covered with a resin 12 that conforms to the shapes of the cavities 4; and the distal end of the lead terminal 10 is extended outside the resin 12.

According to the conventional method for manufacturing separate semiconductor devices using transfer molding, since following the completion of the transfer molding the semiconductor chips are cut off and separated into semiconductor devices, a process to determine the characteristic of each semiconductor device must be performed while the semiconductor devices is aligned in a specific direction, and time is required for an extra process.

SUMMARY OF THE INVENTION

To resolve the problems, according to the invention, while an insulating substrate made of glass epoxy or ceramic, on which multiple semiconductor chips are mounted, is glued to an adhesive sheet, the semiconductor chips are diced. And without the chips being separated into individual semiconductor devices, a recognition camera identifies the position of a substrate electrode for one semiconductor device, and the characteristic (hfe rank) is determined for the semiconductor device whose position is identified, while the positions of a plurality of semiconductor devices located around it are not identified.

Further, according to the invention, since an insulating substrate made of glass epoxy or ceramic is employed, the extension/contraction ratio is greater than a conventional substrate and the intervals between the substrates are slightly shifted. Thus, when the field of view of the recognition camera is set by masking so it equals in size one semiconductor device, the position recognition precision can be improved. Furthermore, when there is a reduction in the area covered, the time required for position recognition can be reduced.

In addition, according to the invention, the positions of the recognition camera and the needle of the probe, which are used for semiconductor device measurement, are fixed, while the substrate whereon the semiconductor devices are mounted is moved. Therefore, both position recognition precision and work speed can be increased, so that the characteristics of a large number of semiconductor devices can be measured extremely easily. Moreover, when the electrode pad of one semiconductor device is identified, and when the distance shifted from the target position is obtained by an image forming apparatus and the next semiconductor chip is moved while taking the obtained distance into account, position recognition can be performed while corrections are constantly provided for the position shifting.

DETAILED DESCRIPTION OF THE PREFERRED EMBODIMENT

The preferred embodiment of the invention will now be described in detail.

Figure 1:
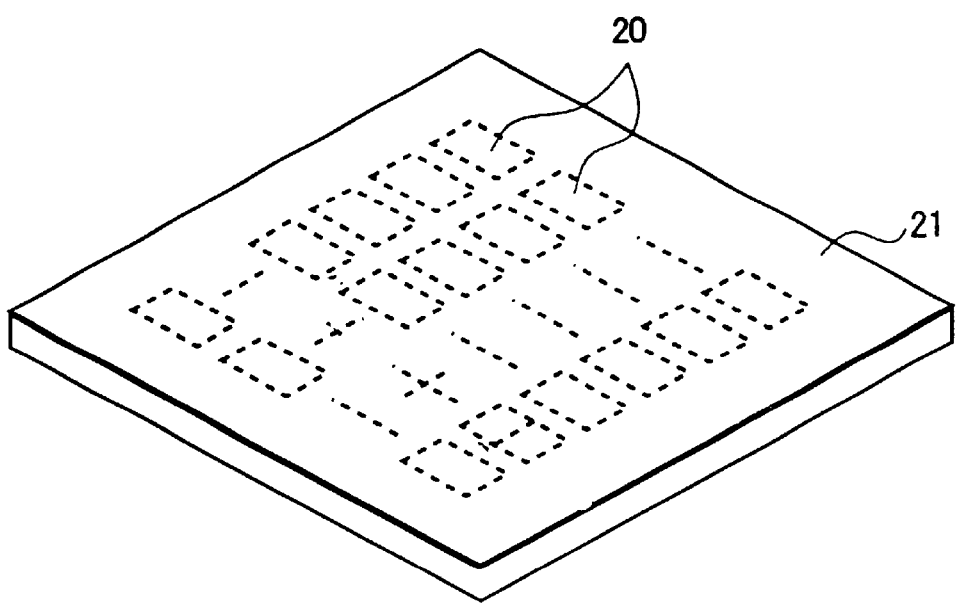
FIG. 1 is a perspective view for explaining a manufacturing method of the invention.
Figure 2A:
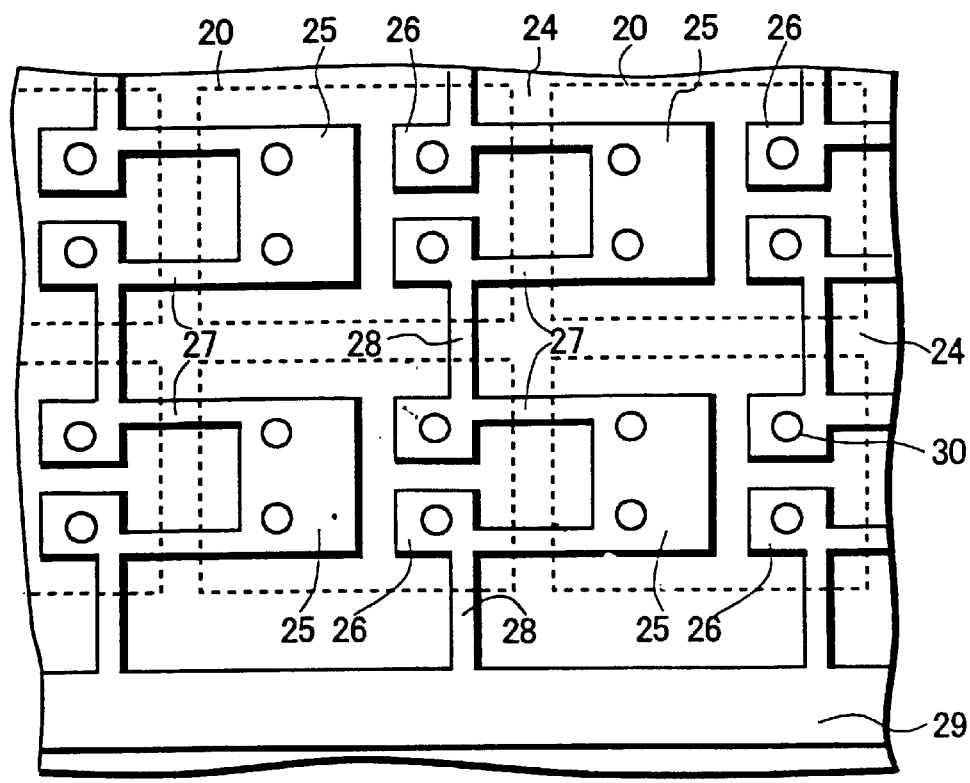
FIG. 2A is a plan view for explaining the manufacturing method of the invention and FIG. 2B is a cross-sectional view for explaining the manufacturing method of the invention.
Figure 2B:
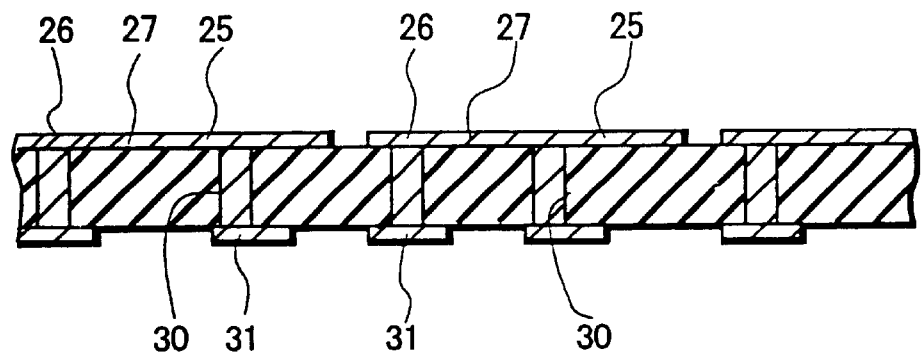
Figure 3:
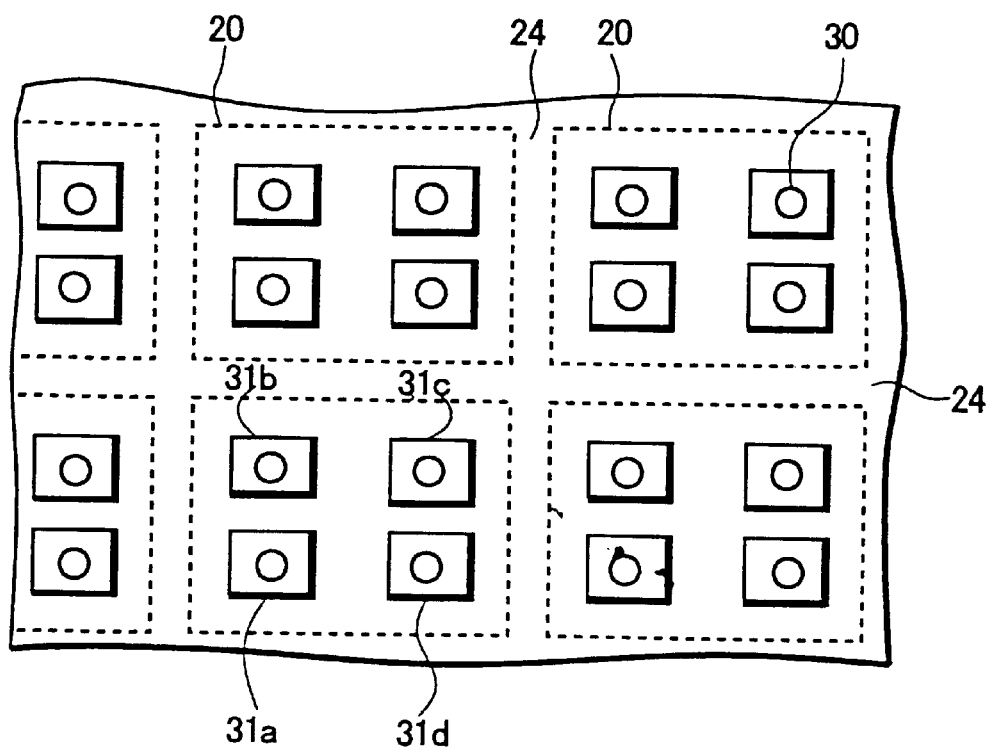
FIG. 3 is a plan view for explaining the manufacturing method of the invention.

A first step for this invention is the preparation of a substrate having multiple mounting portions, as is shown in FIGS. 1 to 3.

First, as is shown in FIG. 1, a large substrate 21 is prepared whereon positions are laid out for multiple mounting portions 20 for corresponding semiconductor devices, so as to provide, for example, a 100-mounting portion 20 arrangement of 10 rows and 10 columns. The substrate 21 is a single or a multilayered glass epoxy or ceramic substrate having a total 200 to 350 [$\mu$m] thickness that will provide adequate mechanical strength during the manufacturing process.

On the obverse surface of each mounting portion 20 on the substrate 21, a metal paste, such as tungsten, is printed on the obverse surface of each mounting portion 20 and a conductive pattern is formed by means of electrolytic-plating with gold. In addition, as an external connection electrode, an electrode pattern is formed on the reverse surface of the substrate 21.

FIG. 2A is a plan view of a conductive pattern formed on the surface of the substrate 21, and FIG. 2B is a cross-sectional view of the substrate 21.

The mounting portions 20 enclosed with broken lines are shaped like rectangles having, for example, long sides of 1.0 mm and short sides of 0.8 mm, and are arranged vertically and horizontally at intervals of 20 to 25 [$\mu$m]. These intervals are used as dicing lines 24 for the following step. As the conductive patterns, island portions 25 and lead portions 26 are formed in each mounting portion 20, and have the same shape in all mounting portions 20. The island portions 25 are where the semiconductor chips are mounted, and the lead portions 26 are the portions that are connected by wires to the electrode pads on the semiconductor chips. Two first connecting portions 27 are extended from each island portion 25 to the lead portions 26 of adjacent mounting portion 20 with a continued pattern, and passing over dicing lines 24 on the way. The line width of the first connecting portions 27 is narrower than the island portion 25, e.g., 0.1 [mm]. In addition, second connecting portions 28, which also pass over dicing lines 24 but in a direction that is perpendicular to that of the first connecting portions 27, are extended from lead portions 26 to the lead portions 26 of adjacent mounting portions 20 or to a common connecting portion 29 that encloses the entire group of mounting portions 20. Since the first and the second connecting portions 27 and 28 are extended as they are, the island portions 25 and the lead portions 26 of all the mounting portions 20 are connected electrically. This arrangement is used because of the common electrodes that are prepared to perform electrolytic plating with gold or the like.

In FIG. 2B, a through hole 30 is formed in each mounting portion 20 on the insulating substrate 21 and is filled with a conductive material, such as tungsten. And for each through hole 30, a corresponding external electrode 31 is formed on the reverse surface.

FIG. 3 is a plan view of the pattern of external electrodes 31a to 31d, viewed from the reverse surface of the substrate 21. The external electrodes 31a, 31b, 31c and 31d are provided 0.05 to 0.1 [mm] away from the ends of the mounting portions 20. Although an individual pattern is provided for the external electrodes 31, they are all connected to the common connecting portion 29 via the through holes 30. Thus, a gold-plated layer can be formed on all the conductive patterns by an electrolytic plating method for which the conductive pattern on the opposite side is employed as an electrode. Further, only the first and second connecting portions 27 and 28, which have narrow line widths, pass across the dicing lines 24.

Figure 4:
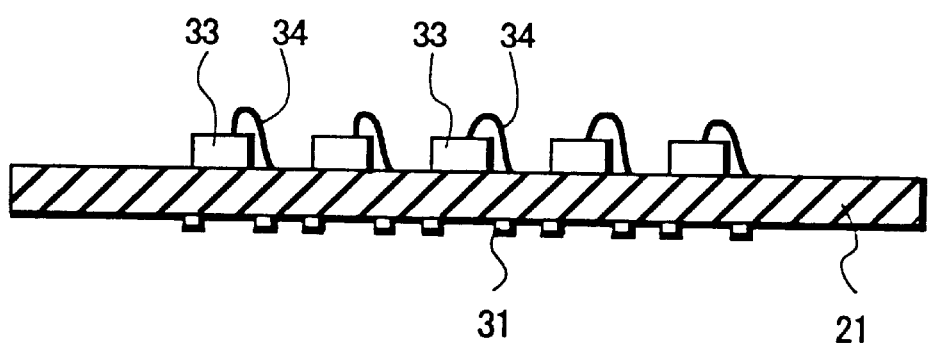
FIG. 4 is a cross-sectional view for explaining the manufacturing method of the invention.

A second step of the invention is to fix a semiconductor chip to each of the mounting portions 20 by wire bonding, as is shown in FIG. 4.

A semiconductor chip 33 is attached by die bonding and wire bonding to each mounting portion 20 of the substrate 21 on which a gold-plated layer is formed. A semiconductor 33 is fixed to the surface of an island portion 25 using an adhesive, such as a Ag paste, and the electrode pad of the semiconductor chip 33 is connected to lead portions by wires 34. As the semiconductor chips 33, active devices are formed that have three terminals, a bipolar transistor and a power MOSFET. When the bipolar devices are mounted, the external electrodes 31a and 31b, which are connected to the island portions 25, act as collector terminals, and the external electrodes 31c and 31d, which are connected to the lead portions 26 act as base-emitter electrodes.

Figure 5A:
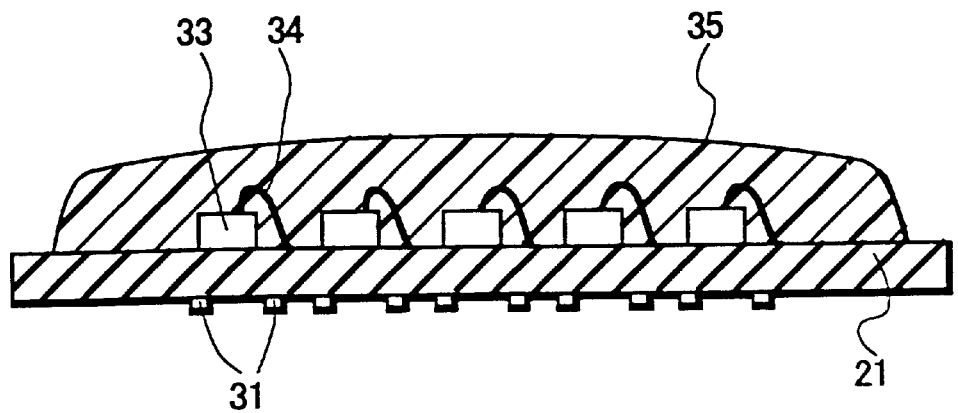
FIG. 5A is a cross-sectional view for explaining the manufacturing method of the invention.
Figure 5B:
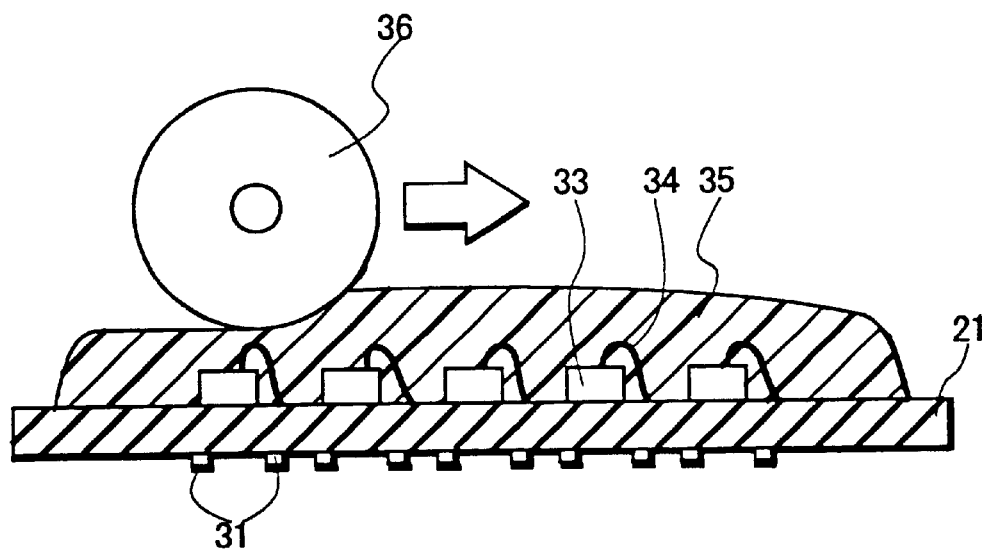
FIG. 5B is a cross-sectional view for explaining the manufacturing method of the invention.

A third step of the invention is to cover the substrate 21 with a resin and to cover, with a common resin layer, the individual semiconductor chips bonded to the mounting portions, as is shown in FIGS. 5A and 5B.

As is shown in FIG. 5A, a predetermined amount of epoxy resin liquid is dropped (potting) from a dispenser (not shown) that is conveyed above the substrate 21, and all the semiconductor chips 33 are covered with a common resin layer 35. When, for example, 100 semiconductor chips 33 are mounted on one substrate 21, all 100 semiconductor chips 33 are collectively covered. For this, CV576AN (Matsushita Electric Works, Ltd.) is employed as the liquid resin. And since the dropped resin liquid is comparatively viscous and has a high surface tension, a curved resin surface is formed.

Following this, as is shown in FIG. 5B, the deposited resin layer 35 is set by employing a thermal process (curing process) for several hours at a temperature of 100 to 200° C., and the surface of the resin layer 35 is then flattened by grinding the curved surface. A dicing machine is employed for the grinding, and a dicing blade 36 is used to grind the surface of the resin layer 35 and provide a surface that is aligned, at a constant height, with the substrate 21. At this step, the height of the resin layer 35 is reduced until it has a thickness of from 0.3 to 1.0 [mm], and the resulting flat surface extends from end to end of the resin layer 35, so that even when the outermost semiconductor chips 33 are separated to obtain individual semiconductor devices, resin packages having a standard external size can be formed. For this process, dicing blades 36 of various thicknesses are prepared, and when the grinding is repeated multiple times using a comparatively thick dicing blade 36, an overall flat structure is formed.

The surface of the resin layer 35 may also be flattened by pressing a flat formation member against the surface of the deposited resin layer 35 before it has fully hardened.

Figure 6A:
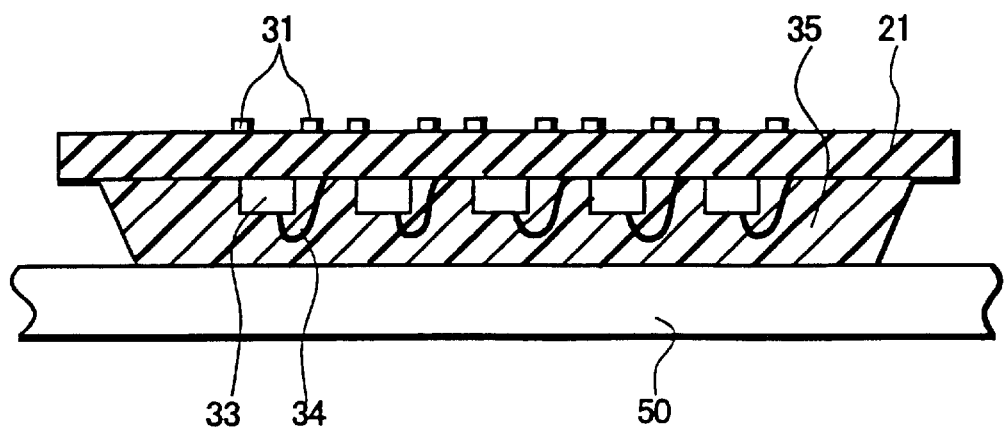
FIG. 6A is a cross-sectional view for explaining the manufacturing method of the invention.
Figure 6B:
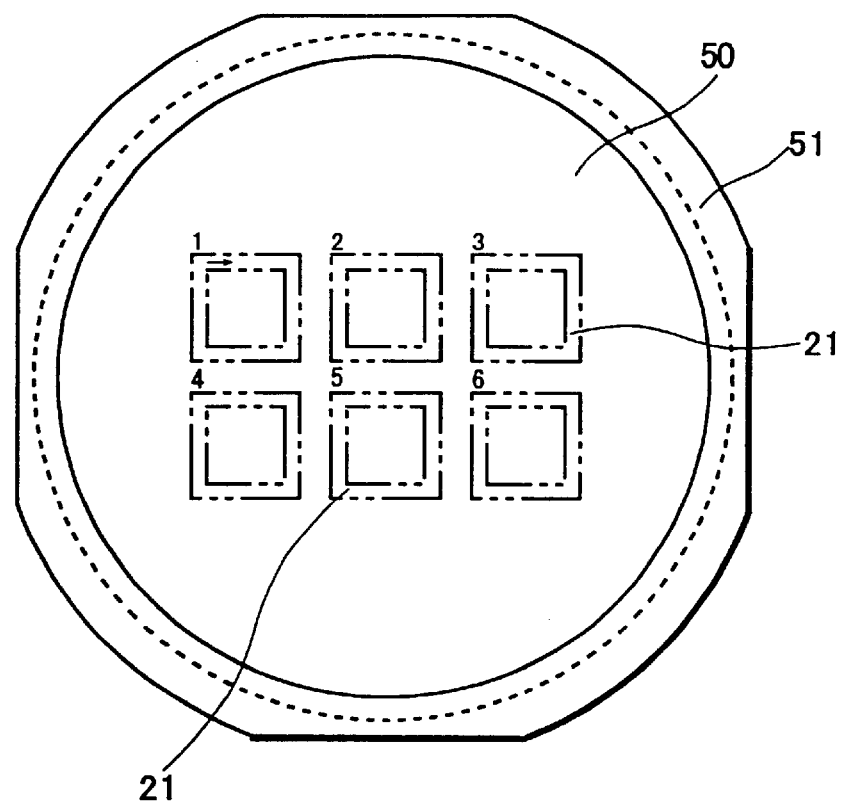
FIG. 6B is a plan view for explaining the manufacturing method of the invention.

A fourth step of the invention is the gluing of a adhesive sheet 50 to the resin layer 35 covering the substrate 21, as is shown in FIGS. 6A and 6B.

As is shown in FIG. 6A, the substrate 21 is inverted, and the adhesive sheet (e.g., a UV sheet, the brand name of a Lintec Corporation product) is glued to the surface of the resin layer 35. Since as a result of the processing performed at the previous step the surface of the resin layer 35 is flat and is horizontal to the surface of the substrate 21, there is no tilting of the substrate 21, even when the adhesive sheet 50 is glued to the surface of the resin layer 35, and horizontal and vertical accuracy is maintained.

As is shown in FIG. 6B, the circumferential edge of the adhesive sheet 50 is glued to a ring-shaped stainless steel metal frame 51, and in its center, six substrates 21 are glued at regular intervals.

Figure 7A:
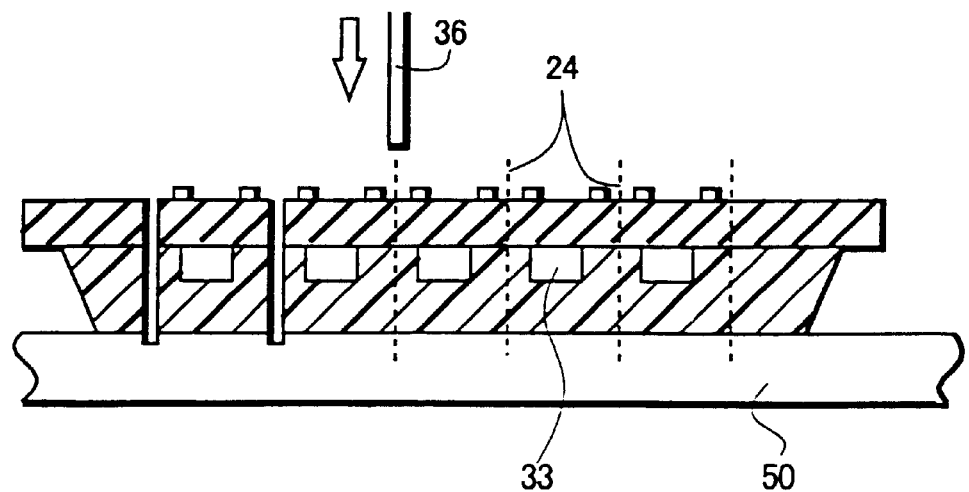
FIG. 7A is a cross-sectional view for explaining the manufacturing method of the invention.
Figure 7B:
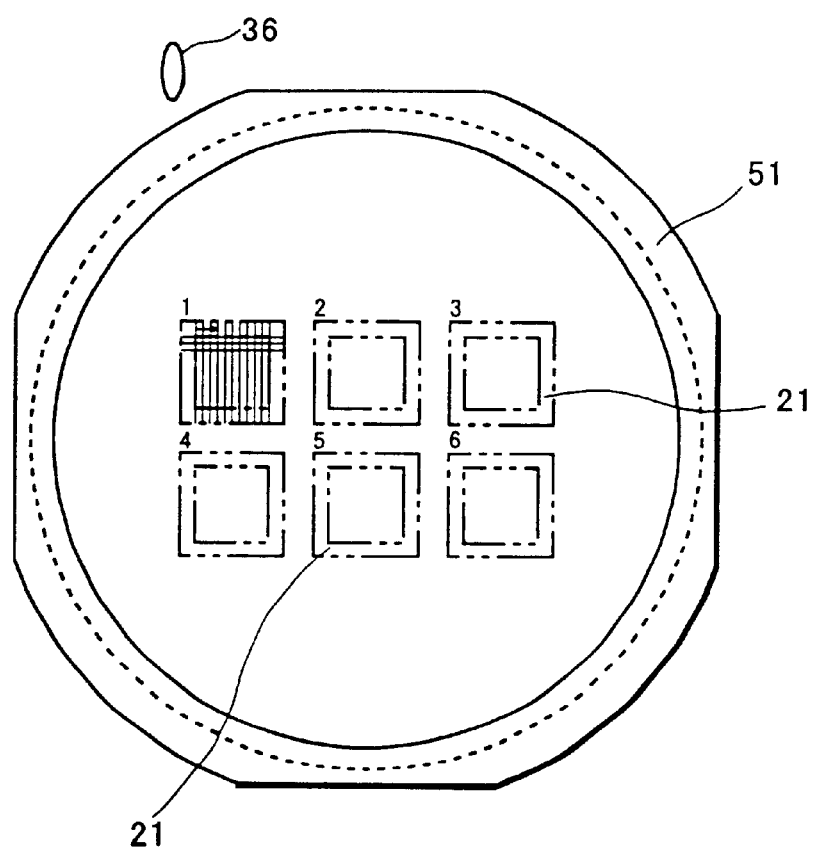
FIG. 7B is a plan view for explaining the manufacturing method of the invention.

A fifth step of the invention, as is shown in FIGS. 7A and 7B, is the dicing of the substrate 21 and the resin layer 35, performed from the reverse side of the substrate 21, to cut out the mounting portions 20 and to thus obtain separate semiconductor devices.

As is shown in FIG. 7A, the substrate 21 and the resin layer 35 around each mounting portion 20 are cut, and separate semiconductor devices are obtained. The resin layer 35 and the substrate 21 are cut at the same time along the dicing lines 24 by the dicing blade 36 of the dicing machine, and separate semiconductor devices are obtained that correspond to the individual mounting portions 20. The cutting depth during the dicing process is such that the dicing blade 36 reaches and penetrates the surface of the adhesive sheet 50. At this time, an alignment mark (e.g., a through hole formed at the perimeter of the substrate 21 or in a portion of the gold-plated layer) that can be observed from the reverse side of the substrate 21 can be automatically identified by the dicing machine, and this alignment mark is used as a position reference while the dicing is being performed. Further, the pattern is so designed that the dicing blade 36 does not contact the conductive patterns 31a, 31b, 31c and 31d and the island portions 25. This is because, since the separation of the gold-plated layer is comparatively inferior, the occurrence of burrs at the gold-plated layer is prevented to the extent possible. Therefore, the dicing blade 36 contacts the gold-plated layer only at the first and the second connecting portions 27 and 28, which are used as electrical connections.

As is shown in FIG. 7B, multiple substrates 21 glued to the adhesive sheet 50, which around its circumference is glued to the metal frame 51, are separated by the dicing machine along the vertical dicing lines 24, which for each substrate 21 are individually identified. Then, the metal frame 51 is rotated 90 degrees, and the substrates 21 are separated along the horizontal dicing lines 24. The semiconductor devices obtained by the dicing continue to be supported on the adhesive sheet 50 by the viscous agent, and are not separated individually.

Figure 8A:
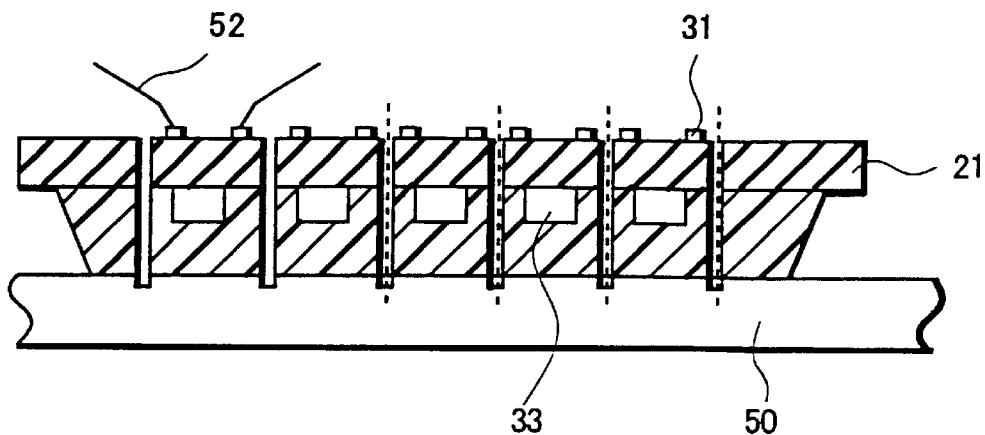
FIG. 8A is a cross-sectional view for explaining the manufacturing method of the invention.
Figure 8B:
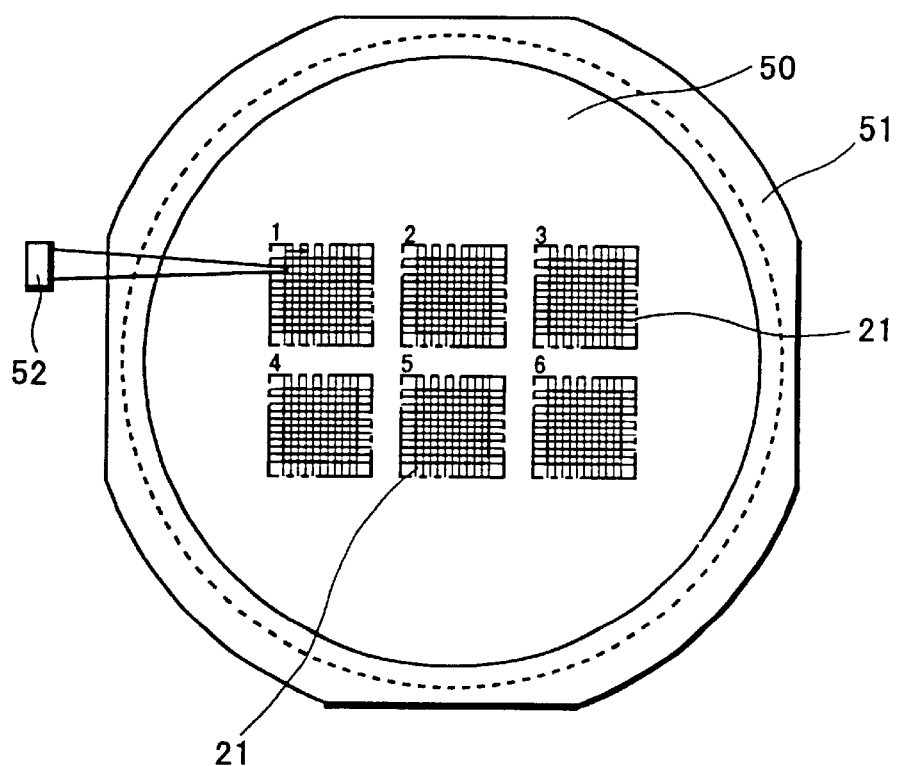
FIG. 8B is a plan view for explaining the manufacturing method of the invention.

A sixth step constitutes the feature of the invention, and as is shown in FIGS. 8A and 8B, provides for the measurement of the characteristic of each of the semiconductor devices integrally supported by the adhesive sheet 50 following the dicing.

As is shown in FIG. 8A, the needles 52 of the probes contact the external electrodes 31a to 31d, which are exposed on the reverse surfaces of the substrates 21 of the semiconductor devices integrally supported by the adhesive sheet 50, and measurements of characteristic parameters are made to ascertain the quality and the characteristics (hferanks) of the individual semiconductor devices. Since insulating substrates made of ceramic or glass epoxy are employed as the substrates 21, the shifting of the positions of the external electrodes 31a to 31d is detected, while taking into account variances in substrate sizes due to extensions or contractions occurring during the manufacturing process and slight position shifts that occur because the substrate is supported by the adhesive sheet 50. Then, while constantly making positioning corrections in accordance with calculations performed to adjust for positioning shifts, the needles 52 of the probes are brought into contact with the external electrodes 31a to 31d and measurements are conducted.

As is shown in FIG. 8B, since multiple substrates 21 are adhered to the metal frame 51, and since the individual semiconductor devices are supported in the state existing following the dicing process, the need to determine which is the obverse and which is the reverse side of a semiconductor device, the need to determine the type of an external electrode, whether it is an emitter, a base or a collector, and the need to determine direction can be eliminated. Measurements are conducted for each substrate 21, row by row, in the direction indicated by an arrow. And when the end of a row is reached, the metal frame 51 is returned to the position it occupied before the row was processed and is shifted so that the next row can be accessed. Since the metal frame 51 is fed a set pitch in the direction of rows, while positioning corrections are made that are equivalent in size to that of a semiconductor device, and since, at the end of a row, the metal frame 51 is returned to the starting position of the row, shifted in the direction of columns and fed a distance equivalent to a pitch in the direction of rows, measurements for a large number of semiconductor devices can be performed extremely easily. In this embodiment described above, the semiconductor device is measured in one direction with respect to the rows of each substrate 21. However, the invention is not limited to this, the measurement may be performed in the opposite direction with respect to alternate rows of each substrate.

Figure 9A:
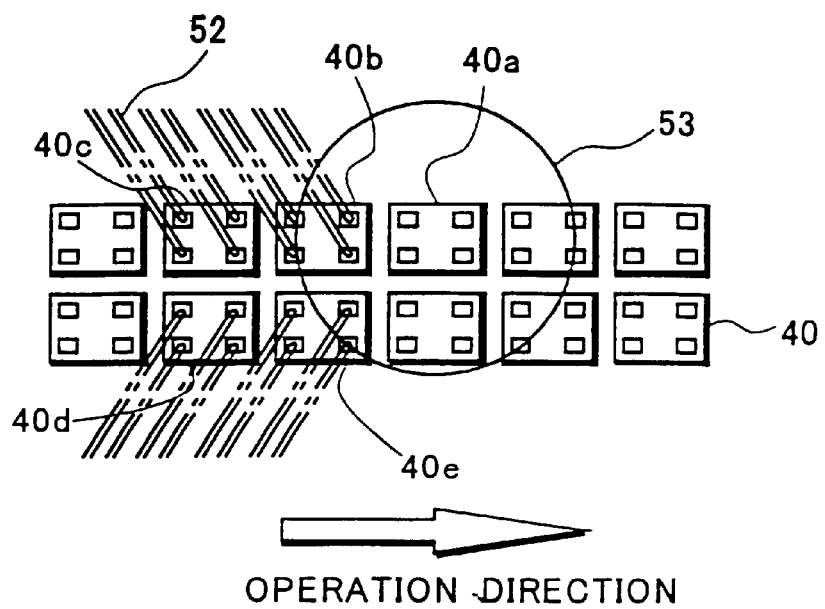
FIG. 9A is a plan view for explaining the manufacturing method of the invention.
Figure 9B:
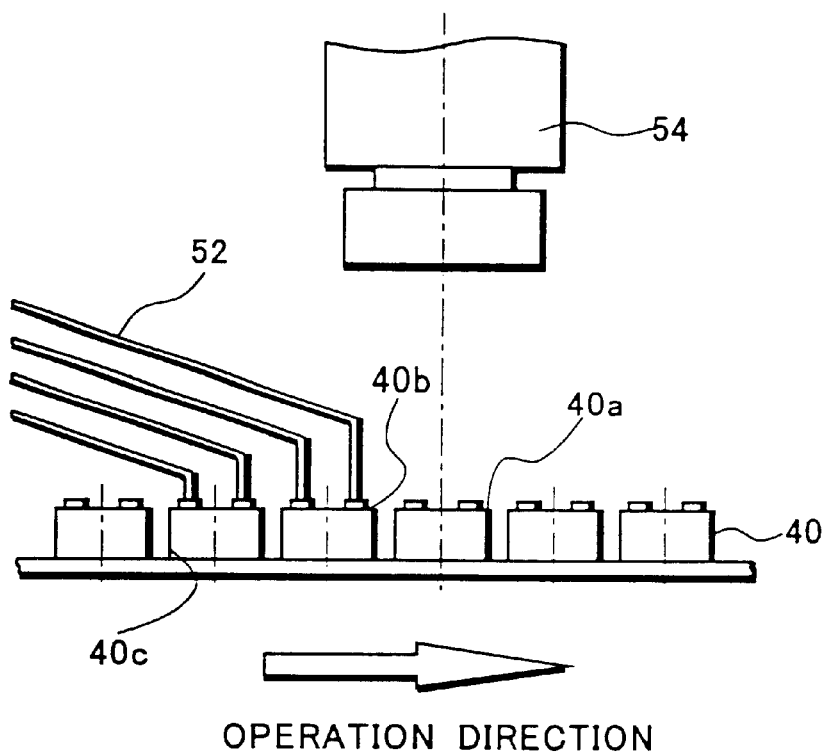
FIG. 9B is a cross-sectional view for explaining the manufacturing method of the invention.

Specifically, as is shown in FIGS. 9A and 9B, the recognition camera 54 captures in the center of a field of view 53 a semiconductor device 40a, and identifies its position. At this time, not only the semiconductor device 40a but also peripheral semiconductor devices, such as 40b and 40e, are captured in the field of view 53. However, the lens of the recognition camera 54 is masked, so that only one semiconductor device is captured in the center of the field of view 53. Therefore, a semiconductor device 40a can be accurately captured in the field of view 53, and position recognition precision can be improved. Especially since small semiconductor devices 40 are collectively formed due to a slight shift in the location of an identified position, interference may occur at the time peripheral semiconductor devices are simultaneously measured, and for this reason, position recognition precision is important.

When the position of a semiconductor device 40c is identified and corrected, the needles 52 of the probes are brought into contact with the electrode pads of adjacent semiconductor devices 40b, 40c, 40d and 40e, and the characteristics of these devices are measured. At this time, for the peripheral semiconductor devices 40b, 40d and 40e positional recognition is eliminated, while it is assumed that their position shifts fall within a permissible range and only their characteristics are measured. As a result, productivity is enhanced.

During the measurement of the semiconductor devices 40b, 40c, 40d and 40e, the position of a succeeding semiconductor device 40a is identified, and as light position shift is detected. While the position shift is corrected, the needles 52 of the probes are brought into contact with the electrode pads of this semiconductor device 40a and multiple adjacent semiconductor devices, and the characteristics of these devices are measured. After this process has been performed for one row, the next row is skipped, and the same process is performed for the following row to be measured. By repeating this process, the characteristics of all the semiconductor devices 40 on a single substrate 21 can be measured. The measurement results that are thereby obtained for the semiconductor devices 40 are stored in the memory of a tester, and are copied to a recording medium such as a floppy disk to be used for the next process.

In the process performed to measure the characteristic of the semiconductor device 40, the positions of the recognition camera 54 and the needle 52 of the probe are fixed, so that to initiate this measurement process the metal frame 51, which supports the semiconductor devices 40, is moved. During the position recognition process, the electrode pads of one semiconductor device 40 are identified, the distance that the target position is shifted is fetched by an image processing apparatus, and the next semiconductor device 40 is moved while taking into account the distance shifted.

In this embodiment, the position of one semiconductor device has been identified, while the characteristics of four adjacent semiconductor devices have been measured. However, instead of four devices, the characteristics of a maximum of ten devices can be measured without their positions being identified.

Figure 10A:
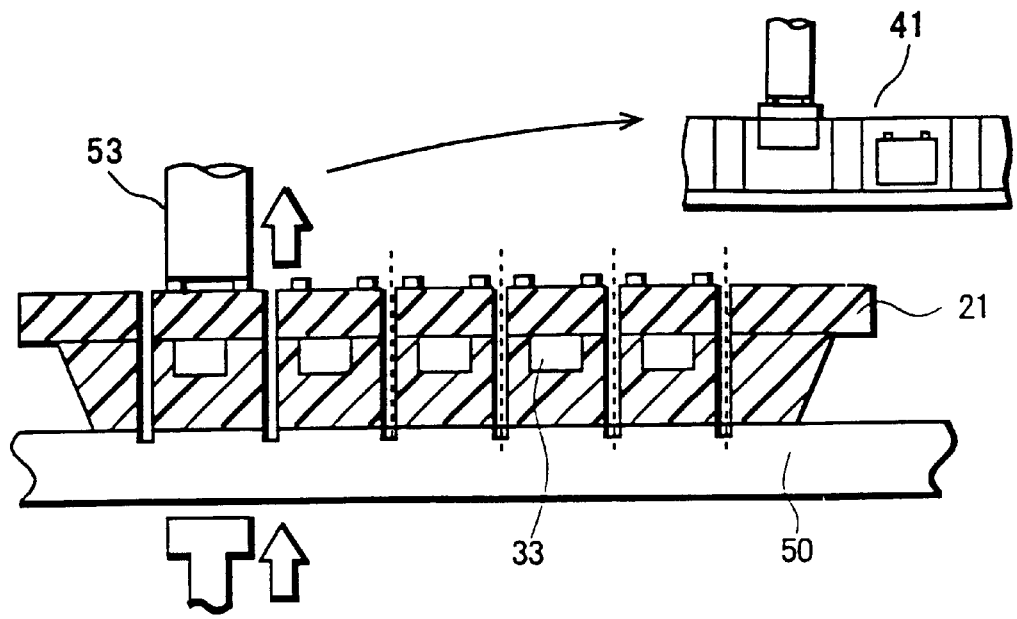
FIG. 10A is a cross-sectional view for explaining the manufacturing method of the invention.
Figure 10B:
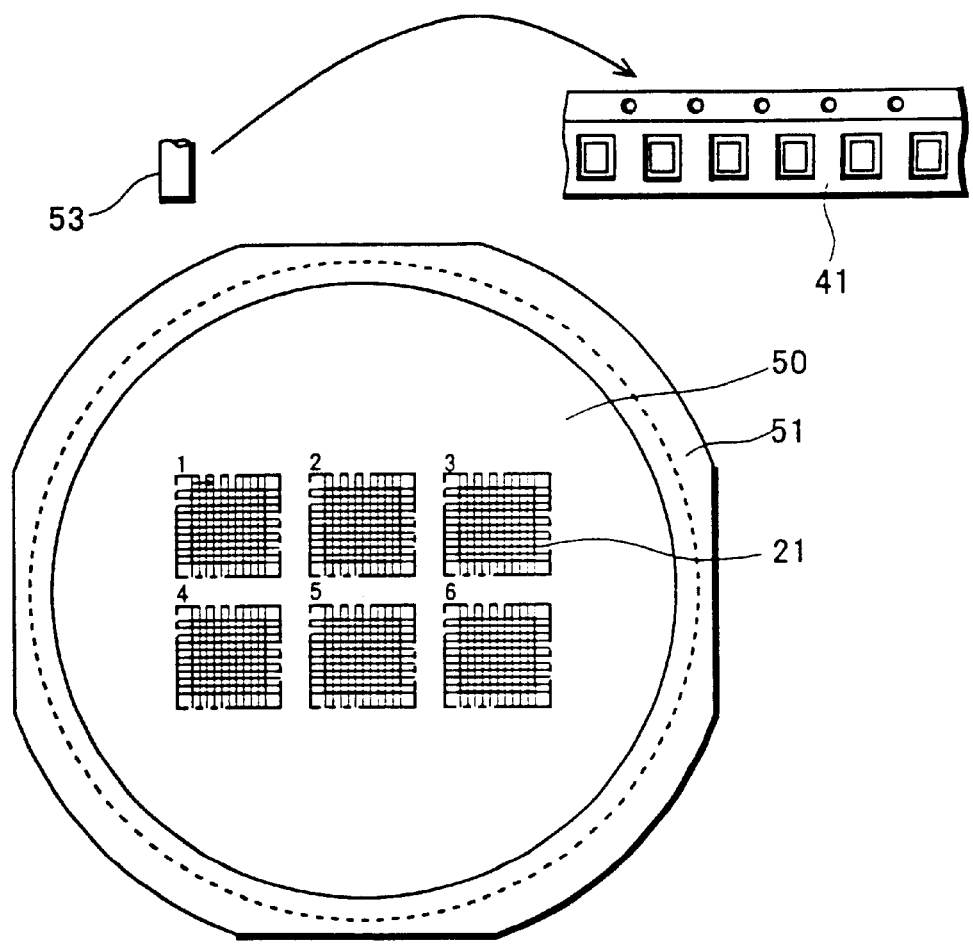
FIG. 10B is a plan view for explaining the manufacturing method of the invention.

A seventh step of the invention is, as is shown in FIGS. 10A and 10B, the direct storage in a carrier tape 41 of the semiconductor devices integrally supported by the adhesive sheet 50.

As is shown in FIG. 10A, after the measurements performed for the semiconductor devices integrally supported by the adhesive sheet 50, only those devices for which excellent results were obtained are peeled from the adhesive sheet 50 by a vacuum collet 53, and are deposited in storage holes in the carrier tape 41.

As is shown in FIG. 10B, multiple substrates 21 are glued to the metal frame 51, and the individual semiconductor devices are supported in the state obtained following the dicing process. Thus, the semiconductor device 40 that requires only the metal frame 51 must be moved in order for semiconductor devices to be stored in the carrier tape 41, but since only a minimum movement is required, a large number of semiconductor devices can be stored, extremely easily, in the carrier tape 40.

Figure 11A:
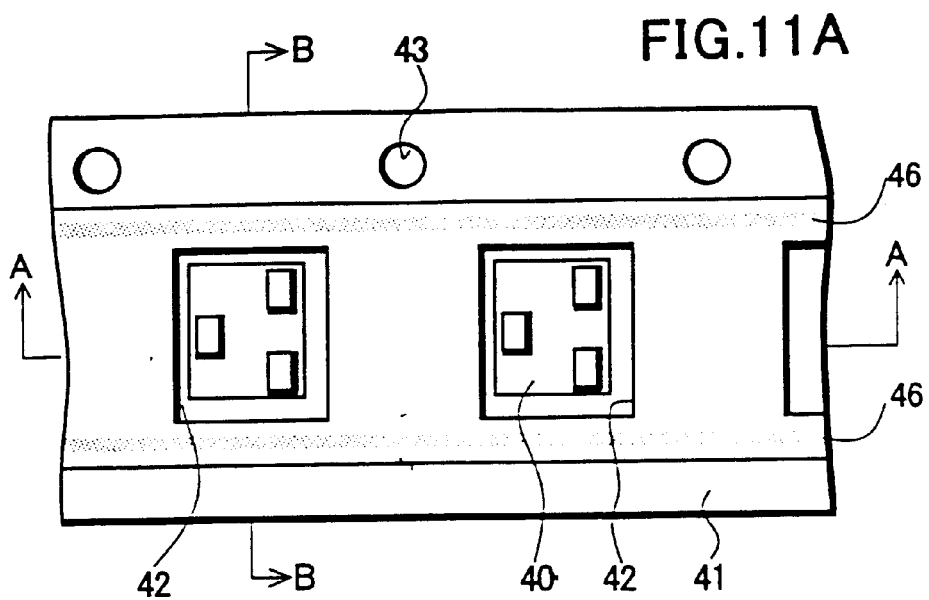
FIG. 11A is a plan view for explaining the manufacturing method of the invention.
Figure 11B:
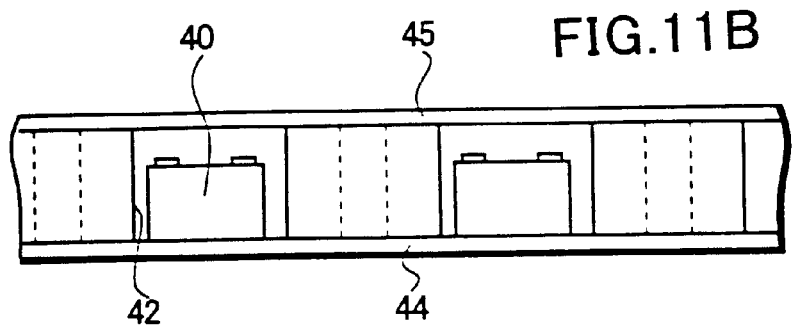
FIG. 11B is a cross-sectional view for explaining the manufacturing method of the invention.
Figure 11C:
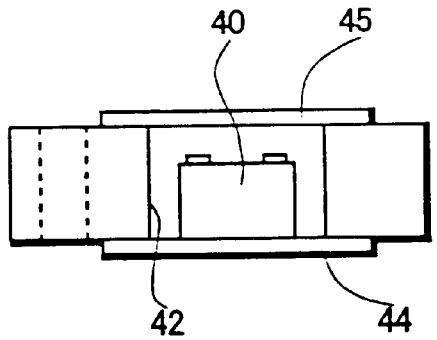
FIG. 11C is a cross-sectional view for explaining the manufacturing method of the invention.

FIG. 11A is a plan view of the carrier tape 41 used for this step, FIG. 11B is a cross-sectional view taken along line AA, and FIG. 11C is a cross-sectional view taken along line BB. The tape 41 is a belt-shaped member having a film thickness of from 0.5 to 1.0 [mm], a width of from 6 to 15 [mm] and a length of several tens of meters, and is made of paper, shaped like corrugated cardboard. Through holes 42 are formed in the tape 41 at predetermined intervals, and feed holes 43 are also formed at a predetermined pitch to feed the tape 41. A die is used to punch the through holes 42 and the feed holes 43 in the tape, and the film thickness of the tape 41 and the size of the through holes 42 are determined in accordance with the sizes of the electronic parts 40 that are to be packed.

A first tape 44 of transparent film is adhered to the reverse surface of the tape 41 to close the bottoms of the through holes 42. And similarly, a second tape 45 of transparent film is adhered to the obverse surface of the tape 41 to close the tops of the through holes 42. The second tape 45 is attached to the tape 41 at adhesive portions 46 near the side edges, while the first tape 44 is attached at corresponding locations along the reverse surface of the tape 41. This adhesive process is performed by thermally bonding the films from above using a member that has heaters positioned at locations corresponding to the adhesion potions 46. After undergoing this adhesive process, the tapes can be peeled apart simply by pulling on the films.

Figure 12A:
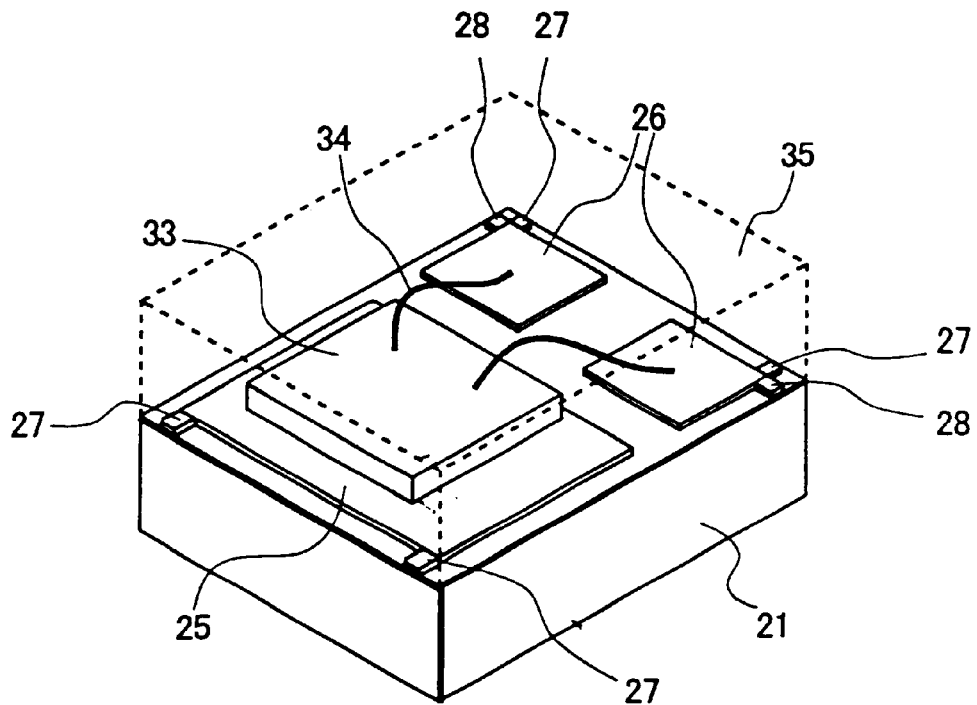
FIG. 12A is a perspective view for explaining the manufacturing method of the invention.
Figure 12B:
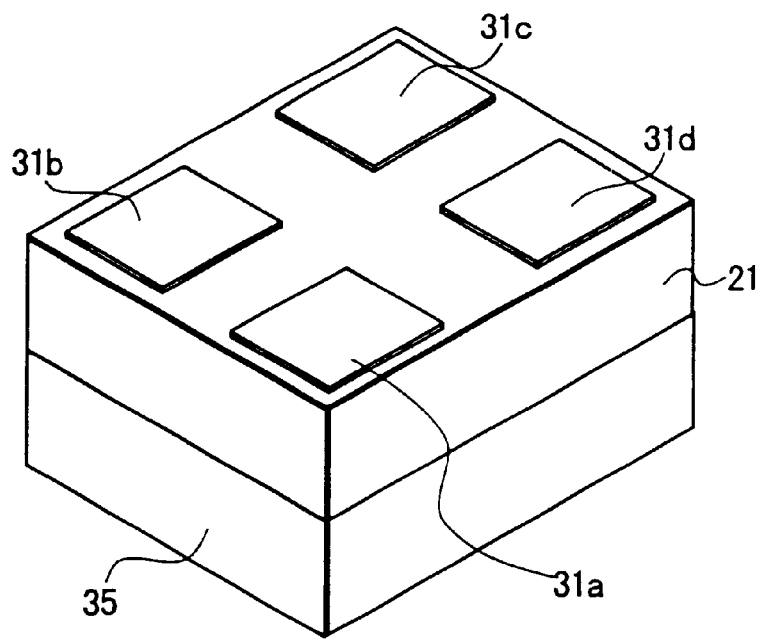
FIG. 12B is a perspective view for explaining the manufacturing method of the invention.
Figure 13:
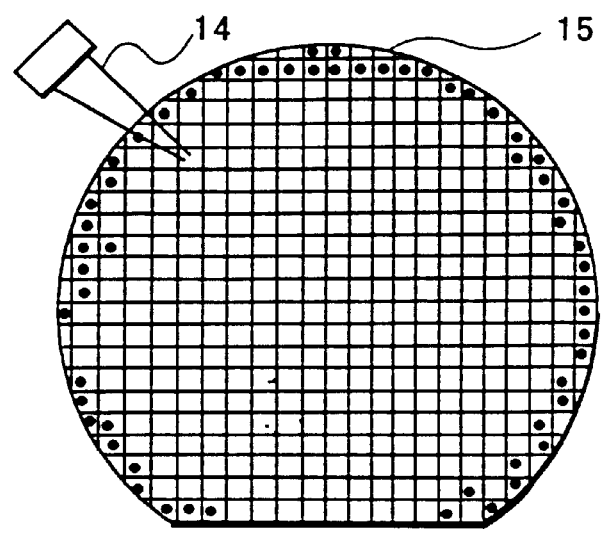
FIG. 13 is a plan view for explaining the conventional example.
Figure 14:
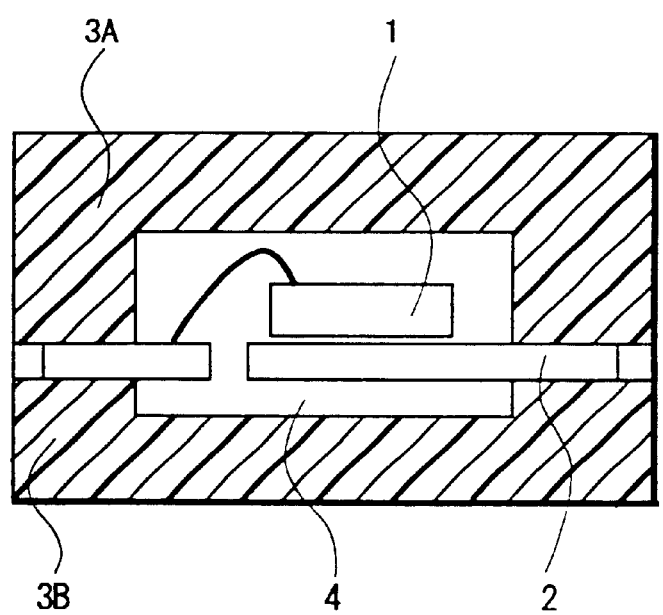
FIG. 14 is a cross-sectional view for explaining the conventional example.
Figure 15:
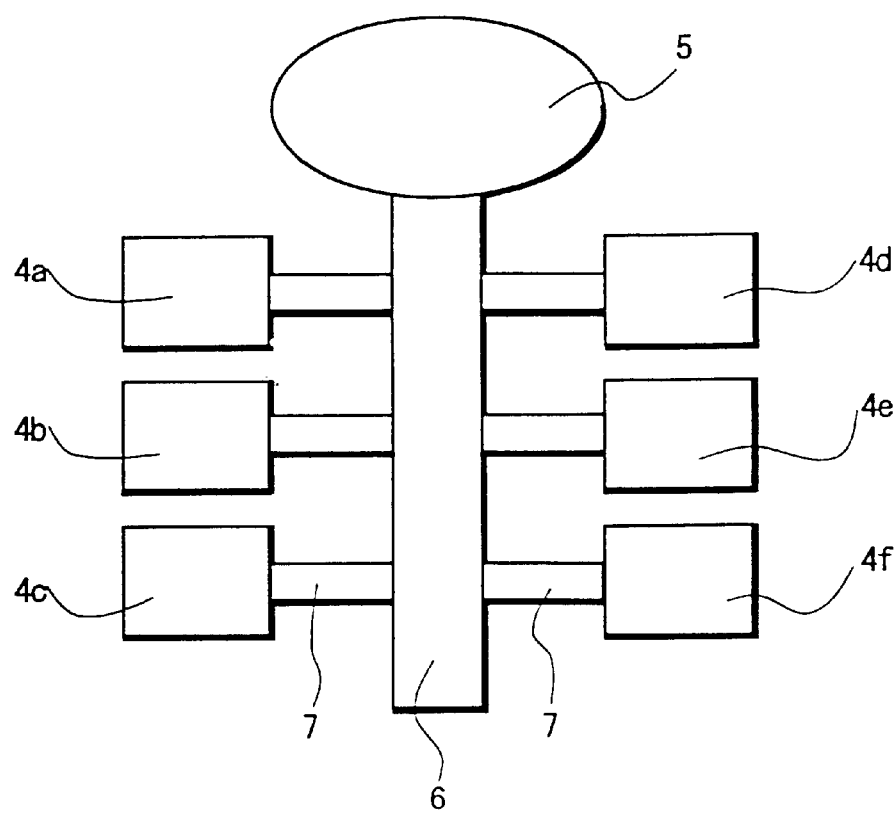
FIG. 15 is a plan view for explaining a conventional example.
Figure 16:
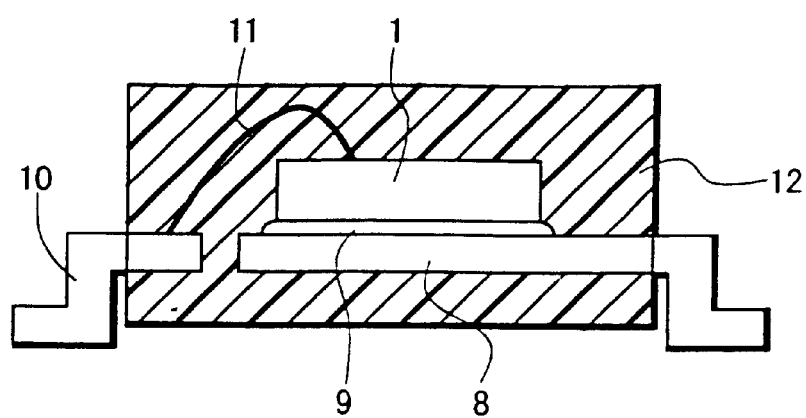
FIG. 16 is a cross-sectional view for explaining the conventional example.

Finally, FIGS. 12A and 12B are perspective views of one semiconductor device package obtained as a result of the above described processing. The four side surfaces of the package are cut surfaces formed when the resin layer 35 and the substrate 21 were cut along the dicing lines 24, the top surface of the package is the flattened surface of the resin layer 35, and the bottom of the package is the reverse surface of the insulating substrate 21.

This semiconductor device has a depth of 1.0 [mm], a width of 0.6 [mm] and a height of 0.5 [mm]. To seal the semiconductor chip 33 which has a thickness of about 150 [$\mu$m], the substrate 21 is covered with the resin layer 35 which has a thickness of about 0.5 [mm]. The island portion 25 and the lead portion 26 are retracted from the end surfaces of the package, and along the package side surfaces, only the cut portions of the first and the second connecting portions 27 and 28 are exposed.

The external electrodes 31a to 31d which are about 0.2×0.3 [mm], are arranged at the four corners of the substrate 21 in a pattern horizontally (vertically) symmetrical to the center line of the external package shape. Since this symmetrical arrangement makes the determination of the polarity of the electrode difficult, it is preferable that a polarity mark be provided by forming an indentation in the obverse surface of the resin layer, or by a printed mark.

Since with this manufacturing method semiconductor devices are produced by collectively packaging multiple devices, a reduction can be realized in the resin material that is wasted, compared with when such devices are individually packaged, and expenditures for material can be reduced. Also, since a lead frame is not required, a package can be provided that, when compared with the conventional transfer molding method, has a considerably smaller external size. And in addition, since external connection terminals are formed on the reverse surface of the substrate 21 so that they do not protrude and extend outward from the package, a considerably reduced mounting area is required for the device.

Further, according to the manufacturing method of the invention, for the dicing, the adhesive sheet 50 is glued not to the substrate 21 but to the resin layer 35. If, for example, the adhesive sheet 50 were glued to the substrate 21, when the devices were removed from the adhesive sheet 50, the viscous agent from the adhesive sheet 50 would be attached to the surfaces of the external electrodes 31a to 31d. And if the device were introduced to the automatic mounting apparatus while the viscous agent was attached, soldering of the electrodes 31a to 31d would be deteriorated. Further, a problem due to the attachment of dust to the surfaces of the electrodes 31a to 31d should also be taken into account. However, since the adhesive sheet 50 is attached to the resin layer 35 in this invention, these problems are resolved.

Since the surface of the resin layer 35 is flattened and is horizontal to the substrate 21 before the adhesive sheet 50 is adhered to the resin layer 35, the same vertical and horizontal accuracy can be maintained as is obtained when the adhesive sheet 50 is adhered to the substrate 21.

In this embodiment, four external electrodes are formed while the three-terminal devices are sealed. However, this embodiment can also be applied to a case wherein two semiconductor chips are sealed or an integrated circuit is sealed.

According to the invention, first, in the process for measuring the characteristics of a semiconductor device, the recognition camera identifies the position of one semiconductor device, and the characteristics of other, adjacent semiconductor devices are measured, without the positions of multiple adjacent semiconductor devices being identified. Therefore, the time required by the semiconductor devices for position recognition can be reduced, and a manufacturing method can be implemented according to which the mass production of semiconductor devices is greatly increased.

Secondly, the recognition camera employs the electrode pads of the semiconductor device to identify a position, while the field of view of the camera is narrowed by masking to obtain a size equivalent to one semiconductor device. Thus, a manufacturing method for a semiconductor device can be provided that affords improved position recognition accuracy.

Third, in the process for measuring the characteristic of a semiconductor device, the positions of the recognition camera and the needles of the probes are fixed, and the metal frame to which the semiconductor devices are secured is moved. Thus, during the position recognition process, the locations of the electrode pads on one semiconductor device are identified, the distance shifted away from the target position is fetched by an image forming apparatus, and the succeeding semiconductor device is moved while taking into account the distance to be shifted. Therefore, a manufacturing method can be provided that, for accuracy, provides for semiconductor devices improved positioning and semiconductor device recognition.

What is claimed is:

1. A manufacturing method for a semiconductor device comprising steps of:

fixing semiconductor chips onto a substrate;

covering the semiconductor chips fixed onto the substrate with a common resin layer;

gluing an adhesive sheet onto the resin layer;

cutting the substrate and the resin layer in a state that the adhesive sheet is glued to the resin layer; and measuring the semiconductor devices in a state that the adhesive sheet is glued to the resin layer, wherein positions of external electrodes on the substrate of one of the semiconductor chips are identified, wherein the measurement is performed for the semiconductor chip whose position is identified, and for another semiconductor chips located around the semiconductor chip and the positions of the semiconductor chips are not identified.

2. A manufacturing method for a semiconductor device according to claim 1, wherein the semiconductor chips whose position are not identified are four semiconductor chips located around the semiconductor chip whose position is identified.

3. A manufacturing method for a semiconductor device according to claim 1, wherein the measurement is performed by using of needles of probes, wherein the position of the semiconductor chip is identified by using of a camera, wherein, for the measurement of the semiconductor chips, the camera and the needles of a probes are mounted at fixed positions, and the semiconductor chips are measured while being moved.

4. A manufacturing method for a semiconductor device according to claim 3, wherein, to identify the position of an electrode on the substrate of the semiconductor chip, the field of view of the camera is reduced by masking to a distance equivalent in size to one of the semiconductor chips.

5. A manufacturing method for a semiconductor device according to claim 1, wherein the substrate and the resin layer which are cut are integrally supported by the adhesive sheet.

6. A manufacturing method for a semiconductor device according to claim 1, wherein the external electrodes are provided on the reverse surface of the substrate and electrically connected to the semiconductor chips.

* * * * *